United States Patent
Satoh et al.

(10) Patent No.: US 9,166,154 B2
(45) Date of Patent: Oct. 20, 2015

(54) MTJ STACK AND BOTTOM ELECTRODE PATTERNING PROCESS WITH ION BEAM ETCHING USING A SINGLE MASK

(71) Applicant: Avalanche Technology Inc., Fremont, CA (US)

(72) Inventors: Kimihiro Satoh, Beaverton, OR (US); Dong Ha Jung, Pleasanton, CA (US); Jing Zhang, Los Altos, CA (US); Benjamin Chen, San Jose, CA (US); Yiming Huai, Pleasanton, CA (US); Rajiv Yadav Ranjan, San Jose, CA (US); Yuchen Zhou, San Jose, CA (US)

(73) Assignee: Avalance Technology, Inc., Fremont, CA (US)

( * ) Notice: Subject to any disclaimer, the term of this patent is extended or adjusted under 35 U.S.C. 154(b) by 0 days.

(21) Appl. No.: 14/096,016

(22) Filed: Dec. 4, 2013

(65) Prior Publication Data

US 2014/0170776 A1 Jun. 19, 2014

Related U.S. Application Data

(60) Provisional application No. 61/734,519, filed on Dec. 7, 2012.

(51) Int. Cl.
*H01L 29/04* (2006.01)
*H01L 43/12* (2006.01)

(52) U.S. Cl.
CPC ...................... *H01L 43/12* (2013.01)

(58) Field of Classification Search
CPC ........................................ H01L 43/12
USPC ............................................... 438/3
See application file for complete search history.

(56) References Cited

U.S. PATENT DOCUMENTS

| | | | |
|---|---|---|---|
| 7,183,120 B2 | 2/2007 | Berg et al. | |
| 7,211,447 B2 | 5/2007 | Horng et al. | |
| 7,291,506 B2 * | 11/2007 | Nakajima et al. | 438/3 |
| 7,497,007 B2 | 3/2009 | Wang et al. | |
| 7,897,950 B2 | 3/2011 | Shoji | |
| 7,919,826 B2 | 4/2011 | Iwayama et al. | |
| 7,936,027 B2 | 5/2011 | Xiao et al. | |
| 7,955,870 B2 | 6/2011 | Ditizio | |
| 7,985,667 B2 | 7/2011 | Cho | |
| 8,083,962 B2 * | 12/2011 | Lee et al. | 216/66 |
| 8,536,063 B2 | 9/2013 | Satoh et al. | |
| 8,574,928 B2 | 11/2013 | Satoh et al. | |
| 8,829,580 B2 * | 9/2014 | Sugiura et al. | 257/295 |
| 2005/0254289 A1 * | 11/2005 | Nakajima et al. | 365/158 |

(Continued)

*Primary Examiner* — Caleb Henry
(74) *Attorney, Agent, or Firm* — G. Marlin Knight; Bing K. Yen

(57) ABSTRACT

Fabrication methods using Ion Beam Etching (IBE) for MRAM cell memory elements are described. In embodiments of the invention the top electrode and MTJ main body are etched with one mask using reactive etching such as RIE or magnetized inductively coupled plasma (MICP) for improved selectivity, then the bottom electrode is etched using IBE as specified in various alternative embodiments which include selection of incident angles, wafer rotational rate profiles and optional passivation layer deposited prior to the IBE. The IBE according to the invention etches the bottom electrode without the need for an additional mask by using the layer stack created by the first etching phase as the mask. This makes the bottom electrode self-aligned to MTJ. The IBE also achieves MTJ sidewall cleaning without the need for an additional step.

14 Claims, 8 Drawing Sheets

(56) References Cited

U.S. PATENT DOCUMENTS

| | | |
|---|---|---|
| 2007/0155027 A1 | 7/2007 | Ditizio |
| 2010/0311243 A1 | 12/2010 | Mao |
| 2011/0037108 A1* | 2/2011 | Sugiura et al. ............ 257/295 |
| 2011/0076785 A1 | 3/2011 | Xiao et al. |
| 2011/0254112 A1 | 10/2011 | Yamanaka et al. |
| 2013/0341801 A1 | 12/2013 | Satoh et al. |
| 2014/0042567 A1 | 2/2014 | Jung |

* cited by examiner

MTJ STACK AND BOTTOM ELECTRODE PATTERNING PROCESS WITH ION BEAM ETCHING USING A SINGLE MASK

RELATED APPLICATION

The present application is related to U.S. provisional patent application Ser. No. 61/734,519, filed Dec. 7, 2012, by SATOH et al., which is included by reference herein and for which benefit of the priority date is hereby claimed.

FIELD OF THE INVENTION

The present invention relates to the techniques for fabricating arrays of magnetoresistive random access memory (MRAM) cells such as those including magnetic tunnel junctions (MTJ) memory elements on wafers. The invention relates more particularly to etching processes for fabricating magnetic tunnel junction (MTJ) stacks and the bottom electrode.

BACKGROUND OF THE INVENTION

FIG. 1 illustrates a cross sectional view of a selected stage in the prior art fabrication process of MTJ MRAM arrays after MTJ etching. A memory element of MRAM typically includes of a bottom electrode, a MTJ (Magnetic Tunnel Junction) and a top electrode (TE) 6. The top electrode layer 6 can be a single layer metal or multi-layer stack consisting of metal and dielectric materials. The MTJ is formed with a barrier layer 4 such as MgO sandwiched between a top magnetic layer 5 and a bottom magnetic layer 3. At the stage shown in FIG. 1 the MTJ layers have been etched, but the bottom electrode layer 2 has not been etched. The bottom electrode layer 2 has been deposited over the typical CMOS control structures 1.

Magnetoresistive random access memory (MRAM) cells including magnetic tunnel junctions (MTJ) memory elements can be designed for in-plane or perpendicular magnetization of the MTJ layer structure with respect to the film surface. One of the magnetic layers is designed to serve as a free magnetic layer while the other one has a fixed magnetization direction. The resistivity of the whole MTJ layer stack changes when the magnetization of the free layer changes direction relative to that of the fixed layer, exhibiting a low resistance state when the magnetization orientation of the two ferromagnetic layers is substantially parallel and a high resistance when they are anti-parallel. Therefore, the cells have two stable states that allow the cells to serve as non-volatile memory elements.

The MRAM cells in an array on a chip are connected by metal word and bit lines. Each memory cell is connected to a word line and a bit line. The word lines connect rows of cells, and bit lines connect columns of cells. Typically CMOS structures 1 include a selection transistor which is electrically connected to the MTJ stack through the top or bottom metal contacts. The direction of the current flow is between top and bottom metal electrodes.

FIG. 1 shows a selected stage in the fabrication process after MTJ etching using a conventional mask etching process steps such as lithography and reactive ion etching (RIE). MTJ etching chemistry may create surface damage 7 on sidewall with a depth δ. It should be removed in the next step. The removal process is strongly dependent on the sidewall angle α.

Ion Beam Etching (IBE) has been widely used in various industries for patterning thin films. It is convenient to etch hard materials with chemical etching processes such as RIE (Reactive Ion Etch). It is, however, difficult to find a hard mask material with enough selectivity for use with RIE. Re-deposition of etched material on the sidewall is also a serious concern, because it can make it the device inoperable by forming an electrical short across the barrier layer.

FIG. 2 illustrates a cross sectional view of a selected stage in the prior art fabrication process of bottom electrode etching with normal incidence. A conventional bottom electrode etching process often uses chemistry free etching using Ar, Kr and so on in which the etching products are not volatile. Re-deposition from the top electrode and/or the bottom electrode is a serious concern as illustrated in FIG. 2. When a conductive material is re-deposited on the MTJ sidewall at the barrier layer, the top and bottom magnetic layers are shorted. The re-deposition depends on sidewall slope.

Etching and re-deposition occur simultaneously. When the deposition rate is larger than the etching rate, re-deposition material accumulates on the sidewall. When the etching rate is higher, the sidewall is cleaned up. In vertical directional etching with etch rate ER, the lateral etch component is estimated by (ER/Tan α), where α is the slope of the sidewall. Shallow slope is helpful for preventing the re-deposition. However, it is not desirable for controlling the MTJ size and its uniformity for scalability. This vertical etching method removes top electrode thickness by (δ×Tan α) in order to remove thickness δ of the damaged sidewall layer 7. This amount of top electrode thickness loss is not desirable and would make downstream interconnect process difficult.

The higher or more vertical the slope, the more susceptible it is to re-deposition since the lateral component of etch rate in directional etching ambient such as IBE is, in general, less than the vertical component. Using a tilted incident ion beam increases the etching rate of re-reposition material and thus reduces the net re-deposition. It is not desirable to expose MTJ sidewall to atmosphere for wet cleaning. IBE can advantageously clean the sidewall without exposing to atmosphere.

However, IBE is a purely physical etching process, so the etch rate does not vary greatly among various materials. In other words, IBE material selectivity is low. Specifically, IBE etching selectivity of a hard mask layer versus magnetic materials is not as desirable as that of a chemical etch process such as RIE. A very thick hard mask is therefore required for IBE etching through MTJ stack and BE layers. On the other hand, MTJ components are sensitive to being degraded by the chemical etching ambient, which often degrades TMR (tunnel magneto-resistance). It has been found that the etched surface of MTJ, including the sidewall edge, is damaged in plasma ambient. The damaged depth is estimated to be on the order of several nanometers (nm) from the surface. Tilted angle IBE works to remove the damaged layer. IBE is effective to clean sidewalls.

Another issue is the process sequence and complexity. In some fabrication methods, the main body of MTJ stack and bottom electrode are defined separately using two different photo-masks. Specifically, field MRAM requires the MTJ stack and bottom electrode to be patterned separately. However, separate patterning is not mandatory for STT (Spin Transfer Torque) MRAM. While it is less challenging to fabricate the device from etch point of view, there is a trade-off with process complexity, manufacturing cost, as well as extendibility to high density. In addition to the photo-mask required to pattern MTJ stack, an extra mask is needed to define bottom electrode, which complicates the process flow due to required planarization after each photo processing step, overlay margin tolerance, etc. Also a small cell area cannot be achieved with BE size larger than MTJ size, so this limits extendibility.

SUMMARY OF THE INVENTION

Embodiments of the invention include manufacturing methods using Ion Beam Etching (IBE) to fabricate a memory element for an MRAM cell. In embodiments the top electrode and MTJ main body are etched with one mask using reactive etching such as RIE or magnetized inductively coupled plasma (MICP) for improved selectivity, then the bottom electrode is etched using IBE as specified in various embodiments which include selection of incident angles, wafer rotational rate profiles and optional passivation layer deposited prior to the IBE. The IBE according to the invention etches the bottom electrode without the need for an additional mask by using the layer stack created by the first etching phase as the mask. This makes the bottom electrode self-aligned to MTJ. The IBE also achieves MTJ sidewall cleaning without the need for an additional step.

As discussed above there is benefit in defining the MTJ and bottom electrode with one single mask. One photo process and related process such as planarization, cleaning and so on can be eliminated. Since overlay margin is not necessary, cell size can be reduced, which is key for high density arrays. The invention solves the problem of conductive material re-deposition on MTJ sidewall and/or damaging with chemical reaction during MTJ etch and bottom electrode etching that has been preventing the implementation of the one mask process. Embodiments of the invention use an IBE process with adjustable incidence angle to enable sidewall cleaning and bottom electrode removal simultaneously. Several embodiments using IBE will be described.

First set of embodiments: After the MTJ is patterned by a first etching process, IBE is used for bottom electrode etching. This IBE step is to remove the bottom electrode and clean the sidewall simultaneously. The IBE process can use single incident angle or the IBE process can be split into two steps. The first step removes the exposed bottom electrode layer with a first incident angle selected for faster etch rate, and then the second step uses a second incident angle selected to clean the sidewall. More generally, the IBE process can be split into N steps, where N>2 and the incidence angle for each step can be adjusted independently for each step. The MTJ etch can be by RIE. The RIE can include plasma etching using as inert gas such as Ar. The MTJ etch can also be plasma etching only using pure inert gas like Ar, to reduce the chemical damage on MTJ stack.

In an alternative embodiment the MTJ etch starts with RIE, and RIE stops prior to the barrier layer. The remaining MTJ stack and the bottom electrode are etched by IBE. This prevents MTJ damage by the RIE chemistry.

Optionally the IBE etch gas can be something other than Ar, such as Kr, Xe, etc.

Second set of embodiments: MTJ sidewall is protected by depositing dielectric material after MTJ etching and prior to IBE bottom electrode etching. This prevents the barrier layer from incurring plasma damage. In some embodiments, an oxygen free dielectric material is preferred.

Third set of embodiments: During IBE etch, MTJ CD (Critical Dimension) is self-compensated with selected incident angle for the IBE. The etch rate of IBE depends on the incident angle. One source of MTJ CD variation is due to sidewall slope angle variation. CD can be adjusted by optimizing IBE angles according to the invention.

Fourth set of embodiments: These embodiments apply a variable rotation speed profile to the wafer during IBE etch to achieve differential etching of the MTJs at selected angular positions. The rotation speed is varied at different angular positions in the wafer's rotation cycle to increase or decrease the effective etch time so that different amounts of material are removed by the IBE etch from the MTJ sidewall. Lower rotation speed gives a higher material removal rate. The rotation speed profile can be used to correct for differential redeposition and etching rates for the long and short axes of the MTJ pillars. The rotation speed profile can also be used to modify the aspect ratio of the MTJ pillars.

DETAILED DESCRIPTION OF THE INVENTION

In the following description of the embodiments, reference is made to the accompanying drawings that form a part hereof, and in which is shown by way of illustration of the specific embodiments in which the invention may be practiced. It should be noted that the figures discussed herein are not drawn to scale and do not indicate actual or relative sizes. Any hatching in the figures is used to distinguish layers and does not represent the type of material used. A plurality of arrays of magnetoresistive random access memory (MRAM) cells are typically fabricated simultaneously on a single wafer. The figures and description herein reference only one or two cells of the plurality of cells that will be typically be fabricated simultaneously on a single wafer.

Figure 1:
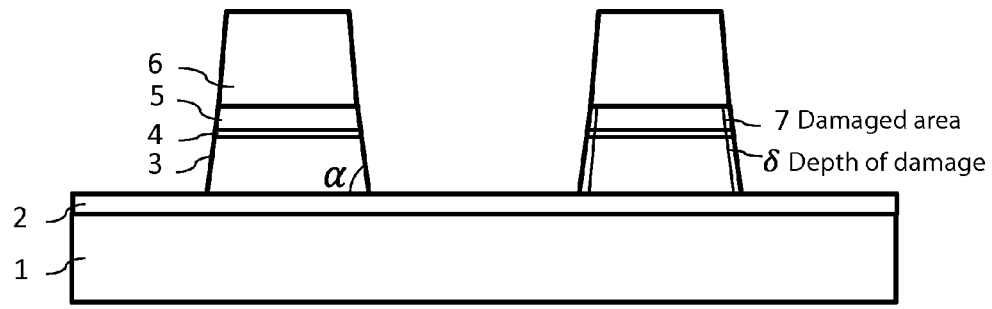
FIG. 1 illustrates a cross sectional view of a selected stage in the prior art fabrication process of MTJ arrays after MTJ etching.
Figure 2:
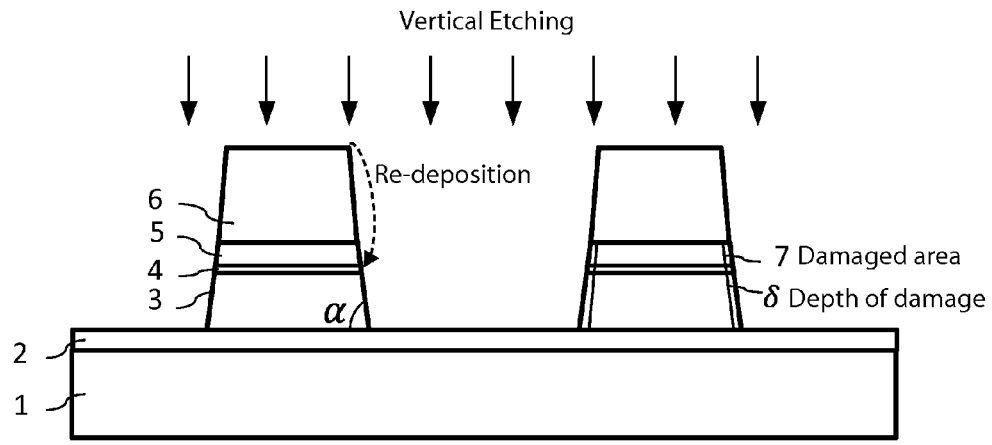
FIG. 2 illustrates a cross sectional view of a selected stage in the prior art fabrication process of bottom electrode etching with normal incidence.
Figure 3:
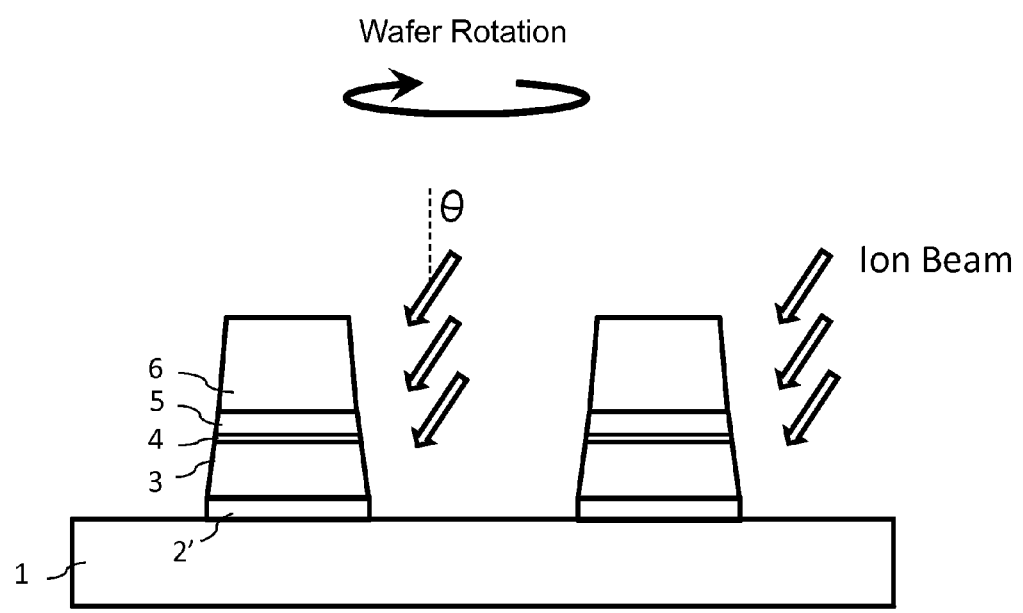
FIG. 3 illustrates a cross sectional view of bottom electrode etch with tilted IBE angle incident according to a first embodiment the invention.

FIG. 3 illustrates a cross sectional view of bottom electrode etch with tilted IBE angle incident according to a first embodiment the invention. The IBE angle incident etching begins from the stage of the process shown in FIG. 1. The previously etching MTJ stacks in effect provide the self-aligned mask for the bottom electrode IBE. The tilted IBE and rotation of the wafer according to a first embodiment of the invention simultaneously etching the exposed bottom electrode layer and cleans the sidewalls of any surface damage caused during the MTJ etching phase. In this embodiment a single fixed IBE angle is selected based on experiment that will remove the exposed bottom electrode layer and clean the sidewalls. The rotation of the wafer can be selected as a uniform rate in this embodiment. In alternative embodiments described below the rotation rate can be systematically varied to achieve certain desirable results.

Tilted incidence angle and wafer rotation provided by IBE are used in embodiments of the invention to address the re-deposition and damage issues described above. Since reactive ion etching (including inductively coupled plasma (ICP) etching) utilizes self-bias generated between parallel plates, the incidence is inherently perpendicular to the wafer surface. Therefore, it cannot be tilted. On the other hand, in the IBE system, a wafer mounting plate and the acceleration field can be manipulated independently. The beam incident angle θ can be tilted as shown in FIG. 3. Since incident angle is defined with reference to a line perpendicular to the plane of the wafer, the term "normal incidence" refers to 0 degree incident angle. Incident angles closer to 0 degree incident angle will be called "low" angles. Similarly as used herein a "higher" angle of incidence refers to a higher angle θ.

In addition, the wafer is mechanically rotated (as illustrated by the curved arrow) for etching uniformity. The tilted IBE is conventionally applied to sidewall cleaning. In embodiments of the invention, it is also simultaneously applied to bottom electrode 2' etching. This process has the advantage of not needing an extra mask other than that required for MTJ etch. It simplifies the process flow and eliminates cell area penalty due to overlay because the bottom electrode 2' is defined by a self-aligned process.

Figure 4A:
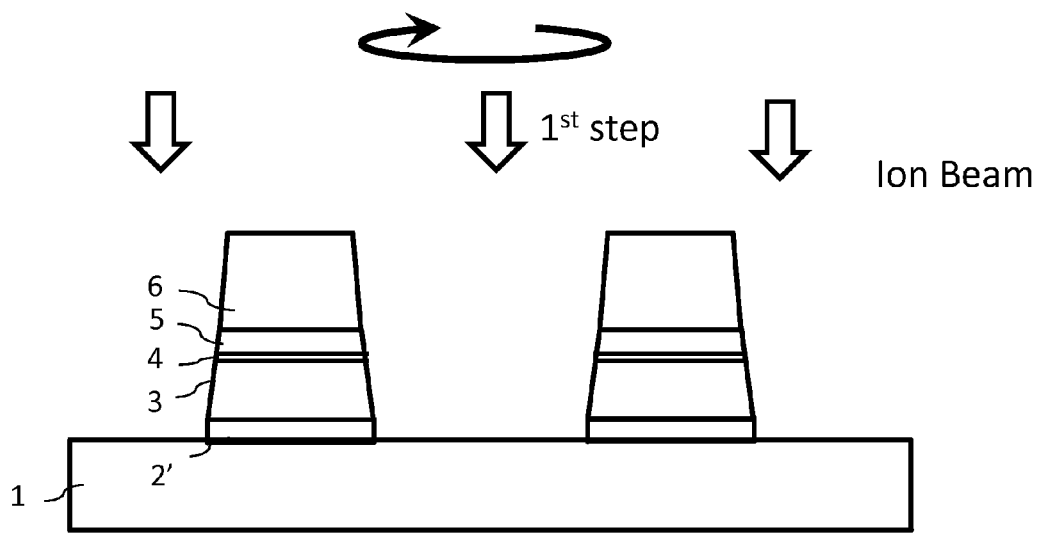
FIGS. 4A and 4B illustrate a cross sectional view of first and second steps of an alternative of the first embodiment.
Figure 4B:
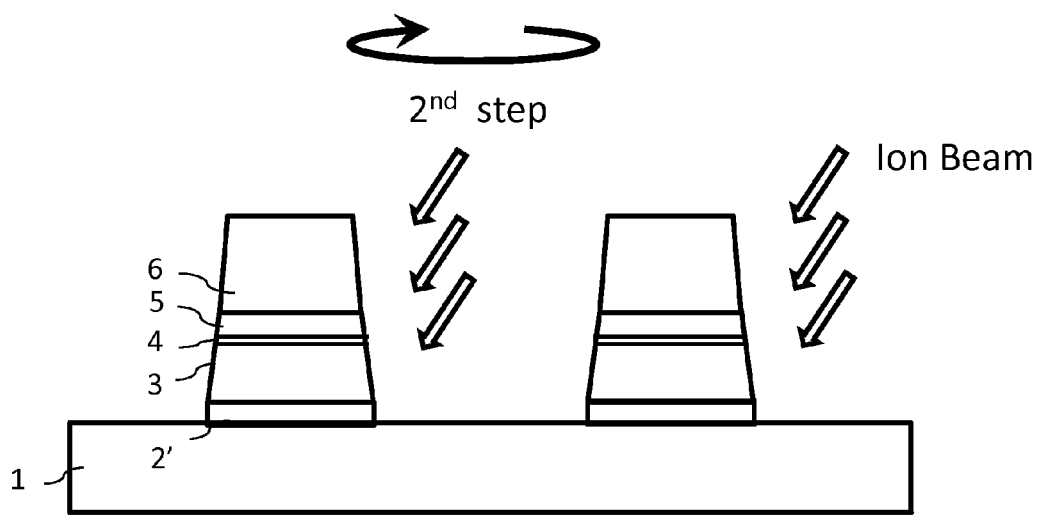

An alternative of the first embodiment separates the IBE bottom electrode etching into 2 steps as shown in FIGS. 4A & 4B. In FIG. 4A the $1^{st}$ step is designed to remove the exposed bottom electrode material with a first angle which is preferably a low angle of incidence (e.g. close to normal) selected to efficiently remove the unneeded bottom electrode material. In some cases, a higher etching angle is effective to remove the bottom electrode but is susceptible to re-deposition. As shown in FIG. 4B, the $2^{nd}$ step is to clean the sidewall with a second incident angle, higher than the first angle.

Variations of the first embodiment include etching the MTJ stack with processes with reduced chemical damage including ICP using inert gas such as Ar or Kr, or a mixture of Ar or Kr with other gases such as $CH_3OH$, $CO$, $NH_3$, etc. This step is followed by the bottom electrode etching with angle IBE for sidewall re-deposition cleaning.

Etch rate of RIE including MICP using inert gas like as Ar or Kr, or pure plasma etching using inert gas like Ar or Kr, is faster than IBE. Thus, the MTJ stack can be relieved from chemical damage of conventional RIE, and achieve better throughput than using pure IBE to etch both MTJ stack and bottom electrode.

Figure 5:
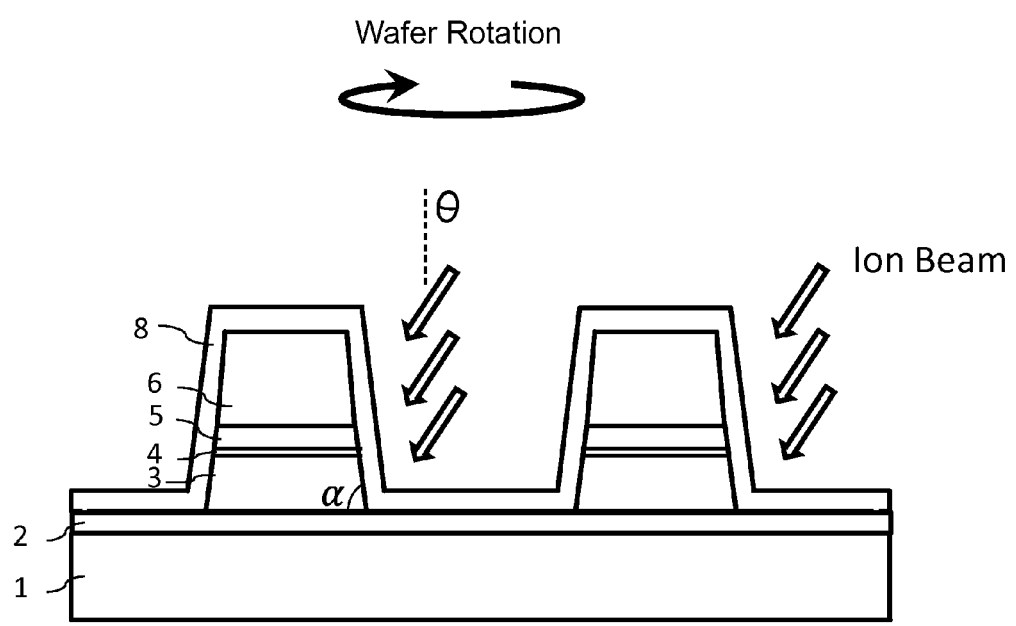
FIG. 5 illustrates a cross sectional view of alternative embodiment that includes deposition of a passivation layer over the MTJ stack prior to bottom electrode etching.

A second embodiment of the invention illustrated in FIG. 5 adds to the first embodiment and its alternatives by including MTJ sidewall protection by depositing passivation layer 8 over the etched MTJ layer stacks and the unetched bottom electrode layer 2 prior to commencing the bottom electrode etching process. The passivation layer 8 can be a material such as a nitride. The passivation layer 8 protects the barrier layer from re-deposition during the bottom electrode IBE with incident angles normal or close to normal. The passivation layer 8 in this embodiment avoids the barrier layer exposed to air when vacuum is broken in some embodiments. The passivation layer 8 is consumed during the IBE process.

Figure 6:
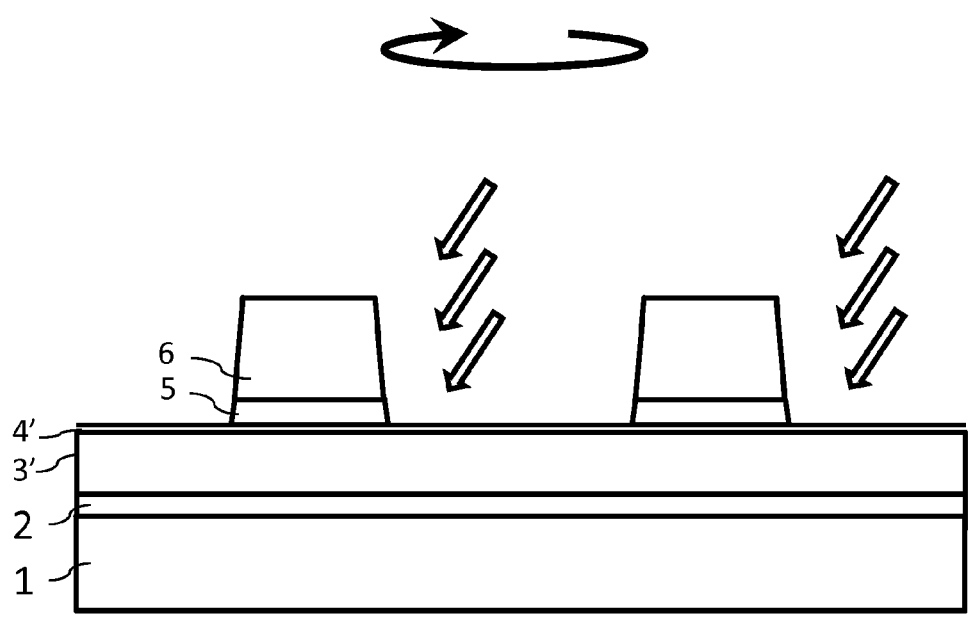
FIG. 6 illustrates a cross sectional view of an alternative embodiment using two stage MTJ etching using RIE down to the barrier layer, then IBE.

FIG. 6 illustrates an alternative embodiment in which the MTJ etching is separated into two stages. The first stage proceeds with RIE etching until the barrier layer 4' is exposed as shown in FIG. 6. At this point angled IBE etching is commenced as shown in FIG. 6. Remaining MTJ layers in the stack are etched using low angle IBE, i.e. close to normal incidence. The bottom electrode is then etched either by the one-step high angle IBE process or the 2-step IBE process with different incident angles as described above. This alternative embodiment prevents damaging of the barrier layer and bottom magnetic layer with RIE chemistry.

Figure 7:
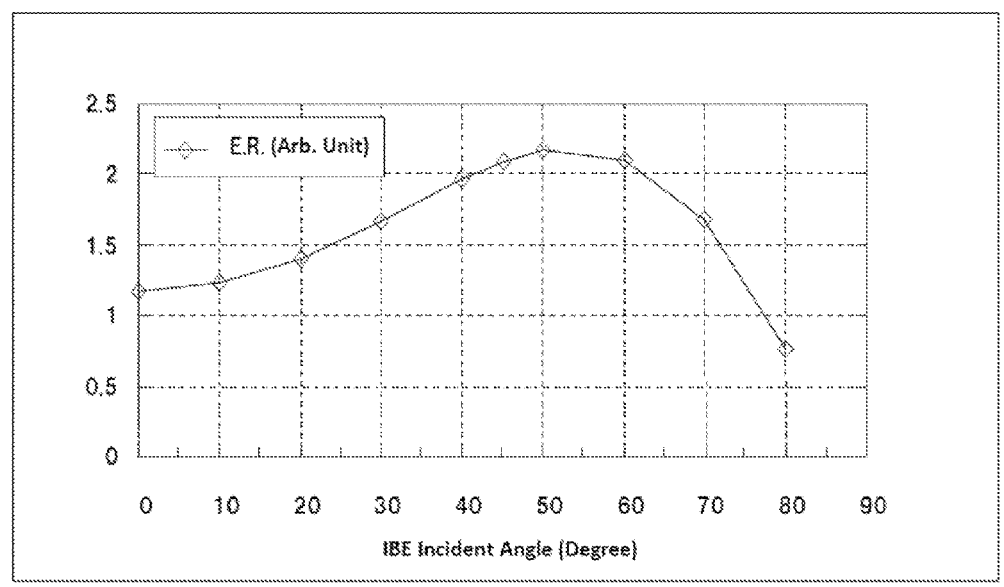
FIG. 7 is a chart showing IBE etch rate as a function of incident angle.
Figure 8:
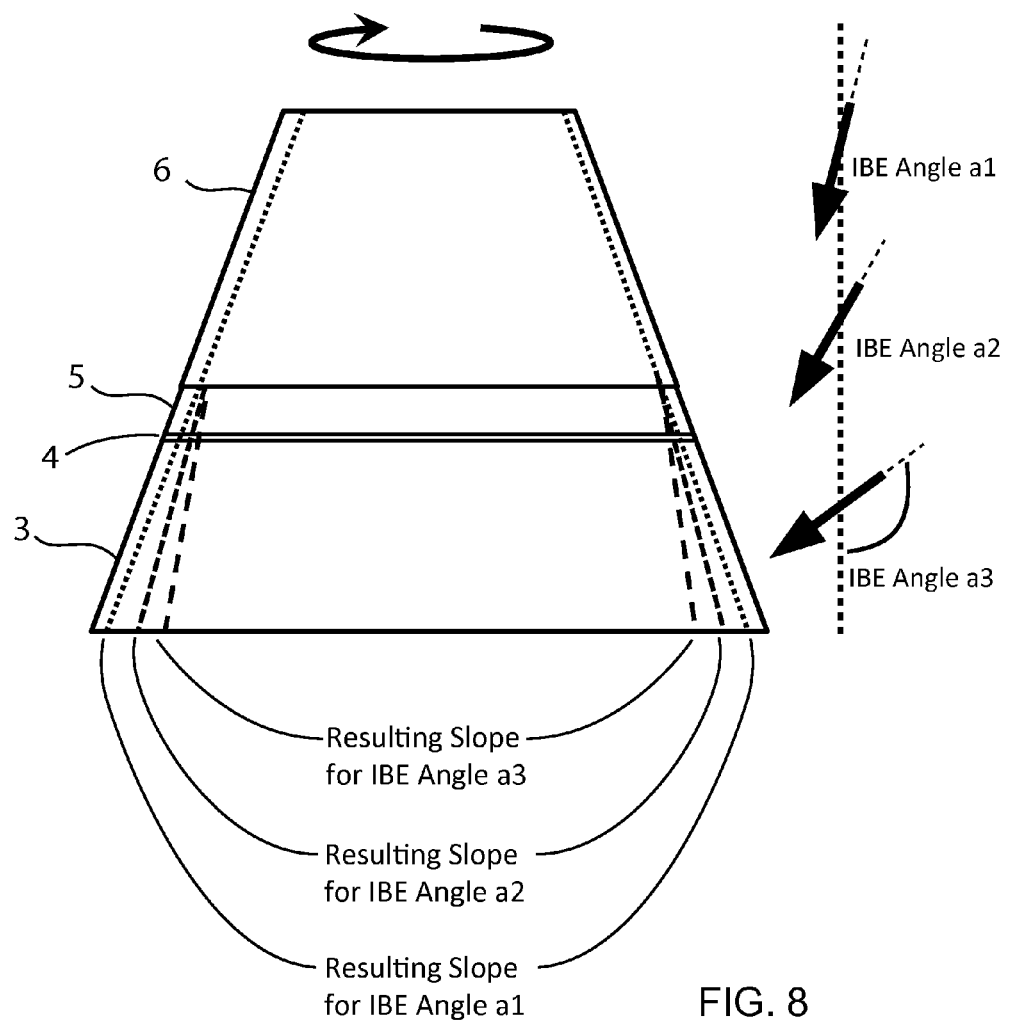
FIG. 8 illustrates a cross sectional view of an embodiment of the invention using IBE angle to control the slope profile of the MTJ.

The third embodiment of the invention includes self-adjustment of MTJ CD (Critical Dimension) with angled IBE. Etch rate of IBE depends on the specific materials as well as the incident angle as shown in FIG. 7. In this example the etch rate is highest at an incident angle of 50 degrees. The etch rate can be separated into vertical and horizontal components which vary with the incident angle of IBE. By varying the incident angle (a1, a2, a3), the bottom slope of MTJ can be changed as shown in FIG. 8 due to different etch rates. The higher angles, such a3, result in greater etching of the lower magnetic layer 3. The lowest angles, such a1 in this example, result in relatively less etching of the lower magnetic layer 3. By selecting an optimal angle, the slope of the bottom of the MTJ can be formed as steep as desired. Control of the slope of the bottom of the MTJ is advantageous for control the CD. A steep side wall makes it easier to control the CD.

FIG. 8 illustrates that the choice of IBE angle affect the slope of the bottom of the MTJ. In an embodiment, the IBE incident angle can be selected as one fixed angle optimized based on experiments. However, because the MTJ is a multilayered film stack and each film can have a unique IBE angle dependence, using more than one angle of incident may work well.

In the foregoing the ion beam incident angle was the focus of the embodiment. In the fourth embodiment of the invention, the direction of the ion beam as viewed in a top view of the wafer is discussed. The fourth embodiment of the invention, see FIGS. 9A, 9B, uses variable rotation speed of IBE stage on which the wafer 10 is mounted during the IBE phase. The ion beam direction remains fixed while the stage with the wafer rotates. The MTJs 11 on the wafer are formed with an oval-shape with short axis A and long axis B oriented in the same direction. As the wafer rotates the ion beam direction in relation to the long and short axis of the MTJs sweeps through 360 degrees cycles.

Re-deposition on sidewall of the oval-shaped MTJ 11 is different between short axis A and long axis B. The sidewall slope along long axis is smaller than that of short axis. The amount of re-deposition is more on along the short axis than the long axis. To correct for this difference, the rotation speed in this embodiment is selected to be lower when the shorter A axis is aligned with the IBE direction than when longer B axis is aligned with the IBE direction as shown in FIG. 9B. Each axis will be aligned with the IBE direction twice during a rotation.

Figure 9A:
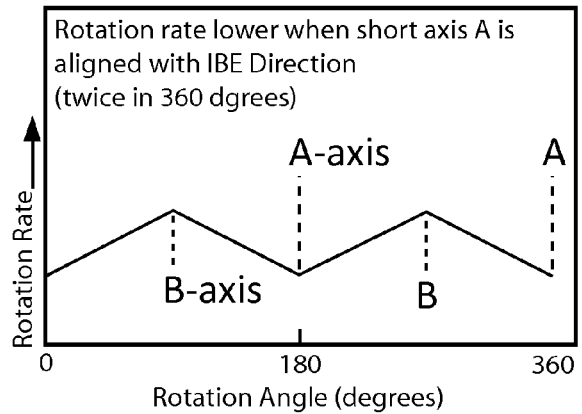
FIG. 9A is a graph illustrating systematic rotational speed variation for the wafer stage during IBE in an embodiment of the invention.
Figure 9B:
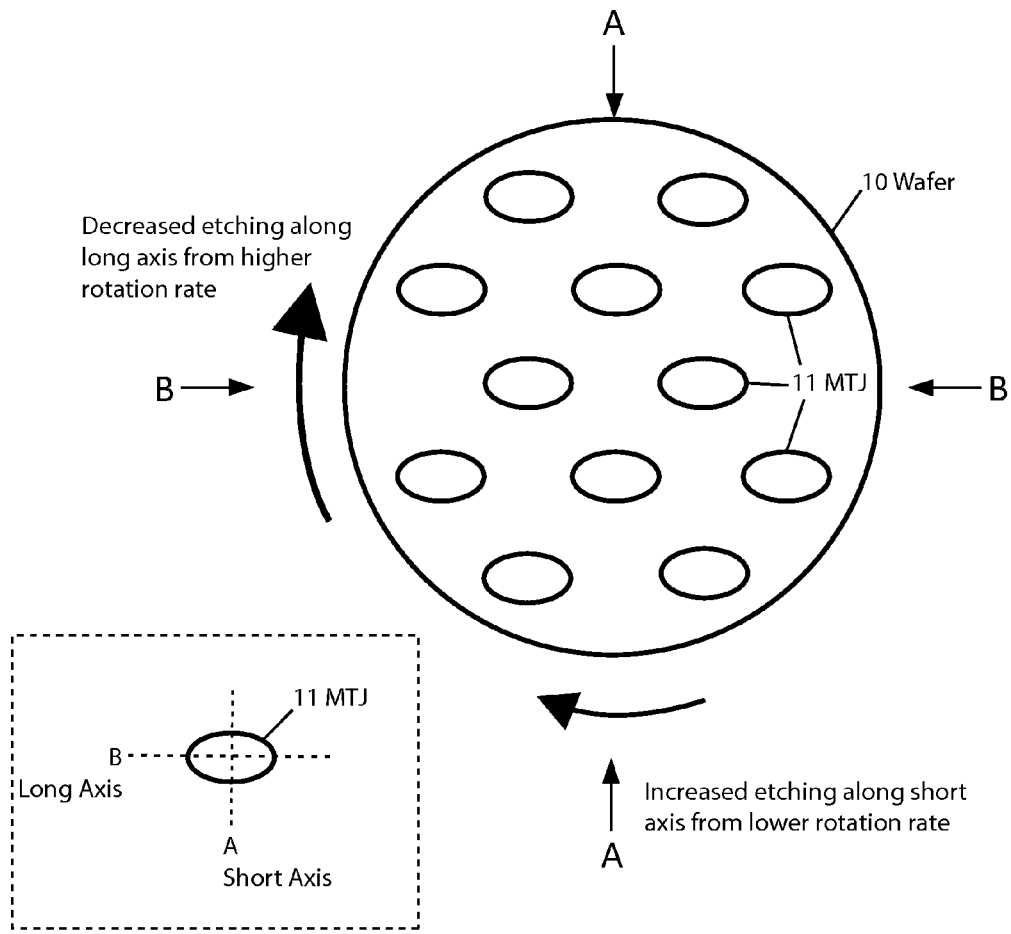
FIG. 9B illustrates a top view of embodiment of the invention using systematic rotational speed variation for the wafer stage during IBE differentially affect IBE etching for the long and short axes of the MTJs.

As illustrated in FIG. 9A, the rotational speed is systematically changed during each 360 degree rotation. Various profiles or algorithms can be used to change the rotational speed during the cycle and the optimal profile should be determined empirically for a particular IBE system, a given MTJ aspect ratio, the shadowing effects that occur, etc. The B axis direction is more susceptible to shadowing. For example, the rate could be varied on a sinusoidal curve or step changes could be made at selected points. In the particular example of FIG. 9A, the rotational speed is changed on a linear, ramp profile. The rotational speed reaches a maximum at the two angles (90 & 270 degrees) where the B axis is aligned with the IBE direction. The rotational speed reaches a minimum at the two angles (180 & 360 degrees) where the A axis is aligned with the IBE direction.

Another potentially beneficial effect that can optionally be obtained by systematically varying the rotation speed through each rotation is that aspect ratio (AR) of MTJ elements can be adjusted. By differentially slowing the rotation rate in relation to a selected axis, which can be the long or short axis, the etch rate is increased for that axis. For example, if the long axis of the MTJs needs to be shortened to change the AR, then systematically slowing the rotation rate when the ion beam is parallel will cause the ratio of the long axis length to short axis length to decrease.

Although the present invention has been described in terms of specific embodiments, it is anticipated that alterations and modifications thereof will no doubt become apparent to those skilled in the art.

The invention claimed is:

1. A method of fabricating an array of memory pillars on a wafer using a single mask, the method comprising:
   depositing a stack of layers for the array of memory pillars including a top electrode layer and a bottom electrode layer with magnetic tunnel junction (MTJ) layers interposed therebetween, the MTJ layers further comprising a top magnetic layer and a bottom magnetic layer with a barrier layer interposed therebetween;
   executing a first etching process to remove areas of at least the top electrode layer and the top magnetic layer not covered by a mask that defines the array of memory pillars; and
   performing a second etching process using ion beam etching to remove areas of remaining layers not covered by the mask, including the bottom electrode layer, to form the array of memory pillars while rotating the wafer and to clean exposed sidewalls of the array of memory pillars including sidewalls of patterned bottom electrode layer, and wherein at least a portion of the ion beam etching is performed at a selected ion beam incidence angle greater than zero degree.

2. The method of claim 1 wherein the first etching process further comprises using reactive ion etching RIE and stopping on the barrier layer.

3. The method of claim 1 wherein the first etching process further comprises using reactive ion etching RIE and stopping etching after exposing the bottom electrode layer.

4. The method of claim 1 wherein the first etching process further comprises using magnetized inductively coupled plasma etching.

5. The method of claim 1 wherein the second etching process further comprises a first etching step that includes removing the bottom electrode layer with a first ion beam incident angle with a first etch rate, and a second etching step that uses a second ion beam incident angle with a second etch rate selected to clean the exposed sidewalls of the array of memory pillars and wherein the first etch rate is higher than the second etch rate.

6. The method of claim 1 wherein the first etching process stops etching after exposing the bottom electrode layer and the method further comprises depositing a dielectric material on sidewalls of patterned MTJ layers after executing the first etching process and before performing the second etching process.

7. The method of claim 6 wherein the dielectric material is an oxygen free dielectric material.

8. The method of claim 1 wherein the selected ion beam incidence angle is selected to achieve a desired slope of sidewalls of patterned MTJ layers.

9. The method of claim 8 wherein the selected ion beam incidence angle is used to control a critical dimension of the patterned MTJ layers.

10. The method of claim 1 wherein rotating the wafer further comprises repetitively varying a rotation speed to achieve differential etching of the MTJ layers at selected angular positions.

11. The method of claim 10 wherein the rotation speed is lower at predetermined angular positions in a rotation cycle to differentially increase a rate of material removal by ion beam etching from sidewalls of patterned MTJ layers at the predetermined angular positions.

12. The method of claim 10 wherein variations in the rotation speed correct for differential redeposition and etching rates between long and short axes of the memory pillars.

13. The method of claim 10 wherein variation in the rotation speed modifies an aspect ratio of the memory pillars.

14. A method of fabricating an array of memory pillars on a wafer using a single mask, the method comprising:
   depositing a stack of layers for the array of memory pillars including a top electrode layer and a bottom electrode layer with magnetic tunnel junction (MTJ) layers interposed therebetween, the MTJ layers further comprising a top magnetic layer and a bottom magnetic layer with a barrier layer interposed therebetween;
   forming a mask on top of the top electrode layer for defining the array of memory pillars;
   executing a first etching process to remove areas of at least the top electrode layer and the top magnetic layer not covered by the mask; and
   performing a second etching process using ion beam etching to remove areas of remaining layers not covered by the mask, including the bottom electrode layer, to form the array of memory pillars while rotating the wafer and to clean exposed sidewalls of the array of memory pillars including sidewalls of patterned bottom electrode layer, and wherein at least a portion of the ion beam etching is performed at a selected ion beam incidence angle greater than zero degree.

* * * * *